(12) United States Patent
Wessendorf

(10) Patent No.: US 7,825,735 B1
(45) Date of Patent: Nov. 2, 2010

(54) DUAL-RANGE LINEARIZED TRANSIMPEDANCE AMPLIFIER SYSTEM

(75) Inventor: Kurt O. Wessendorf, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 12/582,318

(22) Filed: Oct. 20, 2009

(51) Int. Cl.
H03F 3/08 (2006.01)
(52) U.S. Cl. .................. 330/308; 330/278; 330/103
(58) Field of Classification Search ............... 330/308, 330/278, 103
See application file for complete search history.

(56) References Cited

U.S. PATENT DOCUMENTS

| | | | |
|---|---|---|---|
| 4,574,249 A * | 3/1986 | Williams | 330/59 |
| 4,963,829 A * | 10/1990 | Wereb | 324/660 |
| 5,714,909 A * | 2/1998 | Jackson | 330/308 |
| 6,642,795 B2 * | 11/2003 | Koen et al. | 330/298 |
| 6,693,487 B2 * | 2/2004 | Shapiro | 330/86 |
| 7,050,724 B1 | 5/2006 | Rantakari | |
| 7,092,644 B2 | 8/2006 | Davidson | |
| 7,128,264 B2 * | 10/2006 | Barkan et al. | 235/454 |
| 7,205,845 B2 | 4/2007 | Harms et al. | |
| 7,474,978 B2 | 1/2009 | Lum et al. | |
| 7,492,399 B1 | 2/2009 | Gulbransen et al. | |
| 7,777,875 B2 * | 8/2010 | Wolters et al. | 356/237.2 |
| 2003/0090326 A1 | 5/2003 | Pogrebinsky et al. | |

* cited by examiner

*Primary Examiner*—Patricia Nguyen
(74) *Attorney, Agent, or Firm*—John P. Hohimer

(57) ABSTRACT

A transimpedance amplifier system is disclosed which simultaneously generates a low-gain output signal and a high-gain output signal from an input current signal using a single transimpedance amplifier having two different feedback loops with different amplification factors to generate two different output voltage signals. One of the feedback loops includes a resistor, and the other feedback loop includes another resistor in series with one or more diodes. The transimpedance amplifier system includes a signal linearizer to linearize one or both of the low- and high-gain output signals by scaling and adding the two output voltage signals from the transimpedance amplifier. The signal linearizer can be formed either as an analog device using one or two summing amplifiers, or alternately can be formed as a digital device using two analog-to-digital converters and a digital signal processor (e.g. a microprocessor or a computer).

26 Claims, 6 Drawing Sheets

DUAL-RANGE LINEARIZED TRANSIMPEDANCE AMPLIFIER SYSTEM

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to transimpedance amplifiers and, in particular, to a transimpedance amplifier system which provides two different outputs having different signal amplification factors and with one or both of these outputs being linearly related to an input current signal.

BACKGROUND OF THE INVENTION

Transimpedance amplifiers can be used to convert an input current signal into an output voltage signal. This is useful, for example, to process current signals generated by photodetectors from the detection of light. To detect a low-level light signal a relatively large gain is needed for the transimpedance amplifier; whereas for the detection of a high-level light signal this relatively large gain can lead to a saturation of the output voltage signal from the transimpedance amplifier. Thus, there is a need to extend the dynamic range of transimpedance amplifiers so that both low-level light signals and high-level light signals can be detected since, in many cases, the exact signal level of the light is unknown prior to detection.

In the prior art, many different attempts have been made to address the need for transimpedance amplifiers with a high dynamic range (see e.g. U.S. Pat. Nos. 7,050,724; 7,092,644; 7,205,845; 7,474,978; 7,492,399 and U.S. Patent Application Publication No. 2003/0090326). Most, if not all, of the prior art attempts to extend the dynamic range for a single transimpedance amplifier have resulted in an output voltage signal which is nonlinearly related to the input current signal. This is undesirable for applications where the exact shape of the output voltage signal is important to determine characteristics of the input current signal being detected without having to revert to complex mathematical algorithms or look-up tables. Some attempts to extend the dynamic range of transimpedance amplifiers have also used cascaded low-gain amplifiers; but this compromises low-noise performance for increased dynamic range.

The present invention provides an advance in the art by providing a transimpedance amplifier system which generates a pair of output voltage signals from an input current signal using a single transimpedance amplifier. These two output voltage signals are scaled and combined in a signal linearizer to generate a high-gain output signal and a low-gain output signal with one or both of these signals being linearly related to the input current signal.

The transimpedance amplifier system of the present invention does not substantially degrade small-signal noise performance in the high-gain output signal for certain embodiments of the present invention where the high-gain output signal is not linearized. In these embodiments of the present invention, the low-gain output signal has a slightly higher noise level as compared to the high-gain output signal. This is not significant, however, since the low-gain output signal is generally used in preference to the high-gain output signal when the input current signal is relatively large.

These and other advantages of the present invention will become evident to those skilled in the art.

SUMMARY OF THE INVENTION

The present invention relates to a transimpedance amplifier system which receives an input current signal and generates therefrom a low-gain output voltage signal (also referred to herein as a low-gain output signal) and a high-gain output voltage signal (also referred to herein as a high-gain output signal). The transimpedance amplifier system comprises a transimpedance amplifier and a signal linearizer.

The transimpedance amplifier includes a first resistor connected between an output of the transimpedance amplifier and an input thereof, and a series-connected combination of a diode and a second resistor connected between the output of the transimpedance amplifier and the input thereof in parallel with the first resistor. An anode side of the diode is connected to the output of the transimpedance amplifier; and a cathode side of the diode is connected to the second resistor at a node therebetween.

The signal linearizer has a first linearizer input, which is connected to the amplifier output to receive a first output voltage signal (also referred to herein as a first voltage signal) generated from the input current signal by the transimpedance amplifier. The signal linearizer also has a second linearizer input, which is connected to the node between the diode and the second resistor to receive a second output voltage signal (also referred to herein as a second voltage signal) which is generated by the transimpedance amplifier in response to the input current signal. The signal linearizer scales (i.e. attenuates) down the first voltage signal to form a scaled-down first voltage signal, and scales up (i.e. amplifies) the second voltage signal to form a scaled-up second voltage signal. The signal linearizer then combines (i.e. adds) the scaled-down first voltage signal with the second voltage signal to generate the low-gain output signal, and combines the scaled-up second voltage signal with the first voltage signal to generate the high-gain output signal. In this way, the signal linearizer compensates for and corrects any nonlinearities present in the first and second voltage signals to generate the low-gain output signal and the high-gain output signal. Both the low-gain output signal and the high-gain output signal can be linearly related to the input current signal which can be provided, for example, by a photodetector.

The first resistor generally has a resistance which is larger than the resistance of the second resistor (e.g. by up to several orders of magnitude). A first capacitor can be connected in parallel with the first resistor; and a second capacitor can be connected in parallel with the second resistor. These capacitors can be used to provide high-frequency compensation and/or a filter-limited bandwidth for the transimpedance amplifier.

Each diode can comprise a conventional two-terminal semiconductor diode, or alternately can be formed from a transistor having a base, an emitter and a collector by electrically connecting the base to the collector. The use of a transistor to form each diode can be advantageous when the transimpedance amplifier system is fabricated as an integrated circuit (IC).

In certain embodiments of the present invention, the signal linearizer can comprise an attenuator to scale down the first voltage signal and thereby form the scaled-down first voltage signal; a gain stage to scale up the second voltage signal and thereby form the scaled-up second voltage signal; a first summing amplifier to add the scaled-down first voltage signal to the second voltage signal; and a second summing amplifier to add the scaled-up second voltage signal to the first voltage signal.

In other embodiments of the present invention, the signal linearizer can include a pair of analog-to-digital converters and a digital signal processor. This is useful to provide the high- and low-gain output signals as digital signals. In these embodiments, the analog-to-digital converters are used to convert the first voltage signal and the second voltage signal into digital signals. The digital signal processor (e.g. a microprocessor or a computer) then scales down the first voltage signal to form the scaled-down first voltage signal and scales up the second voltage signal to form the scaled-up second voltage signal, with both the scaled-down first voltage signal and the scaled-up second voltage signal being digital signals. The digital signal processor then adds the scaled-down first voltage signal to the second voltage signal to generate the low-gain output signal, and adds the scaled-up second voltage signal to the first voltage signal to generate the high-gain output signal. The digital signal processor can include a memory to store the high- and low-gain output signals. A display can also be provided in the transimpedance amplifier system to display the high- and low-gain output signals.

The present invention also relates to a transimpedance amplifier system to generate a high-gain output signal and a low-gain output signal from an input current signal. The transimpedance amplifier system comprises a transimpedance amplifier and a signal linearizer. The transimpedance amplifier comprises a first feedback loop which includes a first resistor, with the first feedback loop extending between a first output of the transimpedance amplifier and an input thereof wherein the input current signal is received, and a second feedback loop which includes a series connection of one or more diodes and a second resistor, with the second feedback loop extending between the first output of the transimpedance amplifier and the input thereof, and with a second output of the transimpedance amplifier being located at a node connecting one of the diodes to the second resistor. The signal linearizer receives a first voltage signal from the first output of the transimpedance amplifier and attenuates (i.e. scales down) the first voltage signal with an attenuator comprising a resistor dividing network to form an attenuated first voltage signal (also referred to herein as a scaled-down first voltage signal). The signal linearizer also receives a second voltage signal from the second output of the transimpedance amplifier and amplifies (i.e. scales up) the second voltage signal with a gain stage (also referred to herein as an amplifier) to form an amplified second voltage signal (also referred to herein as a scaled-up second voltage signal). The signal linearizer then adds the first voltage signal to the amplified second voltage signal in a first summing amplifier to form the high-gain output signal, and adds the second voltage signal to the attenuated first voltage signal in a second summing amplifier to form the low-gain output signal. The transimpedance amplifier system can be used, for example, with a photodetector providing the input current signal from the detection of a light signal.

A ratio of the attenuated first voltage signal to the first voltage signal can be substantially equal to the ratio of a resistance of the second resistor to the resistance of the first resistor. Similarly, the ratio of the amplified second voltage signal to the second voltage signal can be substantially equal to the ratio of the resistance of the first resistor to the resistance of the second resistor.

Each diode can be formed as a conventional semiconductor diode or alternately can be formed from a transistor having a base, an emitter and a collector, with the base and the collector being electrically connected together.

The first feedback loop can include a first capacitor electrically connected in parallel with the first resistor; and the second feedback loop can include a second capacitor electrically connected in parallel with the second resistor.

The present invention further relates to a transimpedance amplifier system which comprises a transimpedance amplifier having an input to receive an input current signal, and an output; a first feedback loop comprising a first resistor electrically connected between the output and the input of the transimpedance amplifier; a second feedback loop comprising at least one transistor and a second resistor electrically connected in series between the output and the input of the transimpedance amplifier, with each transistor comprising a base, an emitter and a collector, and with the base and the collector of the at least one transistor being electrically connected together and further being electrically connected to the output of the transimpedance amplifier, and with the emitter of the at least one transistor being electrically connected through the second resistor to the input of the transimpedance amplifier; and a signal linearizer having a first linearizer input and a second linearizer input, with the first linearizer input being electrically connected to the output of the transimpedance amplifier to receive a first voltage signal generated from the input current signal by the transimpedance amplifier, and with the second linearizer input being electrically connected to a node wherein the emitter of the at least one transistor is electrically connected to the second resistor to receive a second voltage signal generated from the input current signal by the transimpedance amplifier, and with the linearizer circuit scaling down the first voltage signal to form a scaled-down first voltage signal and scaling up the second voltage signal to form a scaled-up second voltage signal, and with the signal linearizer adding the scaled-down first voltage signal to the second voltage signal to generate the low-gain output signal, and with the signal linearizer adding the scaled-up second voltage signal to the first voltage signal to generate the high-gain output signal. The input current signal can be provided by a photodetector, or by any other type of current source known to the art. A first capacitor can be electrically connected in parallel with the first resistor; and a second capacitor can be electrically connected in parallel with the second resistor.

In certain embodiments of the present invention, the signal linearizer can comprise a resistor dividing network to scale down the first voltage signal to form the scaled-down first voltage signal; an amplifier to scale up the second voltage signal to form the scaled-up second voltage signal; a first summing amplifier to add the scaled-down first voltage signal to the second voltage signal; and a second summing amplifier to add the scaled-up second voltage signal to the first voltage signal. The ratio of the first voltage signal to the scaled-down first voltage signal can be substantially equal to the ratio of the scaled-up second voltage signal to the second voltage signal.

In other embodiments of the present invention, the signal linearizer can include a pair of analog-to-digital converters and a digital signal processor. In these embodiments, the analog-to-digital converters are used to convert the first voltage signal and the second voltage signal into digital signals. The digital signal processor then scales down the first voltage signal to form the scaled-down first voltage signal and scales up the second voltage signal to form the scaled-up second voltage signal. The digital signal processor then adds the scaled-down first voltage signal to the second voltage signal to generate the low-gain output signal, and adds the scaled-up second voltage signal to the first voltage signal to generate the high-gain output signal. The digital signal processor can comprise a microprocessor or a computer. Additionally, a display can be provided in the transimpedance amplifier system to display the low-gain and high-gain output signals.

The present invention also relates to a transimpedance amplifier system which comprises a transimpedance amplifier having an input to receive an input current signal and to generate therefrom a first output voltage signal and a second output voltage signal, with the two output voltage signals having different signal amplification factors, and with the transimpedance amplifier having a first feedback loop which includes a first resistor to provide the first output voltage signal, and with the transimpedance amplifier having a second feedback loop which includes a second resistor and at least one semiconductor diode to provide the second output voltage signal at a node wherein the second resistor is electrically connected to the at least one semiconductor diode; a first analog-to-digital converter to receive the first output voltage and to convert the first output voltage signal into a first digital signal; a second analog-to-digital converter to receive the second output voltage and to convert the second output voltage signal into a second digital signal; and a digital signal processor to receive the first digital signal and the second digital signal, and to scale down the first digital signal to form a scaled-down first digital signal, and to scale up the second digital signal to form a scaled-up second digital signal, with the digital signal processor providing a low-gain output signal from a sum of the scaled-down first digital signal and the second digital signal and providing a high-gain output signal from a sum of the scaled-up second digital signal and the first digital signal, with the low-gain output signal and the high-gain output signal both being linearly related to the input current signal. The digital signal processor can comprise a microprocessor or a computer.

The transimpedance amplifier system can also include a memory to store the low-gain output signal and the high-gain output signal, and a display to display these signals.

Each semiconductor diode in the second feedback loop can be formed as a conventional semiconductor diode, or alternately can be formed from a transistor having a base, an emitter and a collector, with the base being electrically connected to the collector.

The present invention further relates to a transimpedance amplifier system which generates a high-gain output signal and a low-gain output signal from an input current signal. The transimpedance amplifier has a first feedback loop which includes a first resistor, with the first feedback loop extending between a first output of the transimpedance amplifier and an input thereof wherein the input current signal is received. The transimpedance amplifier also includes a second feedback loop which includes a series connection of at least one diode and a second resistor, with the second feedback loop extending between the first output of the transimpedance amplifier and the input thereof. A second output of the transimpedance amplifier is provided at a node connecting the at least one diode to the second resistor. An amplifier is provided in the transimpedance amplifier system, with the amplifier having an amplifier input connected to the transimpedance amplifier at the first output to receive a first voltage signal from the transimpedance amplifier. The amplifier has an amplifier output which provides the high-gain output signal which is generated within the amplifier from the first voltage signal. The transimpedance amplifier system also comprises a signal linearizer which includes a summing amplifier. The summing amplifier has a first summing-amplifier input connected to receive the first voltage signal from the first output of the transimpedance amplifier, and a second summing amplifier input connected to receive a second voltage signal from the second output of the transimpedance amplifier. The summing amplifier also has a summing amplifier output which provides the low-gain output signal which is generated by scaling and adding the first voltage signal and the second voltage signal.

In some embodiments of the invention, a first capacitor can be connected in parallel with the first resistor, and a second capacitor can be connected in parallel with the second resistor. Each diode in the transimpedance amplifier can be formed from a transistor having a base, an emitter and a collector, with the base and the collector being electrically connected together.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
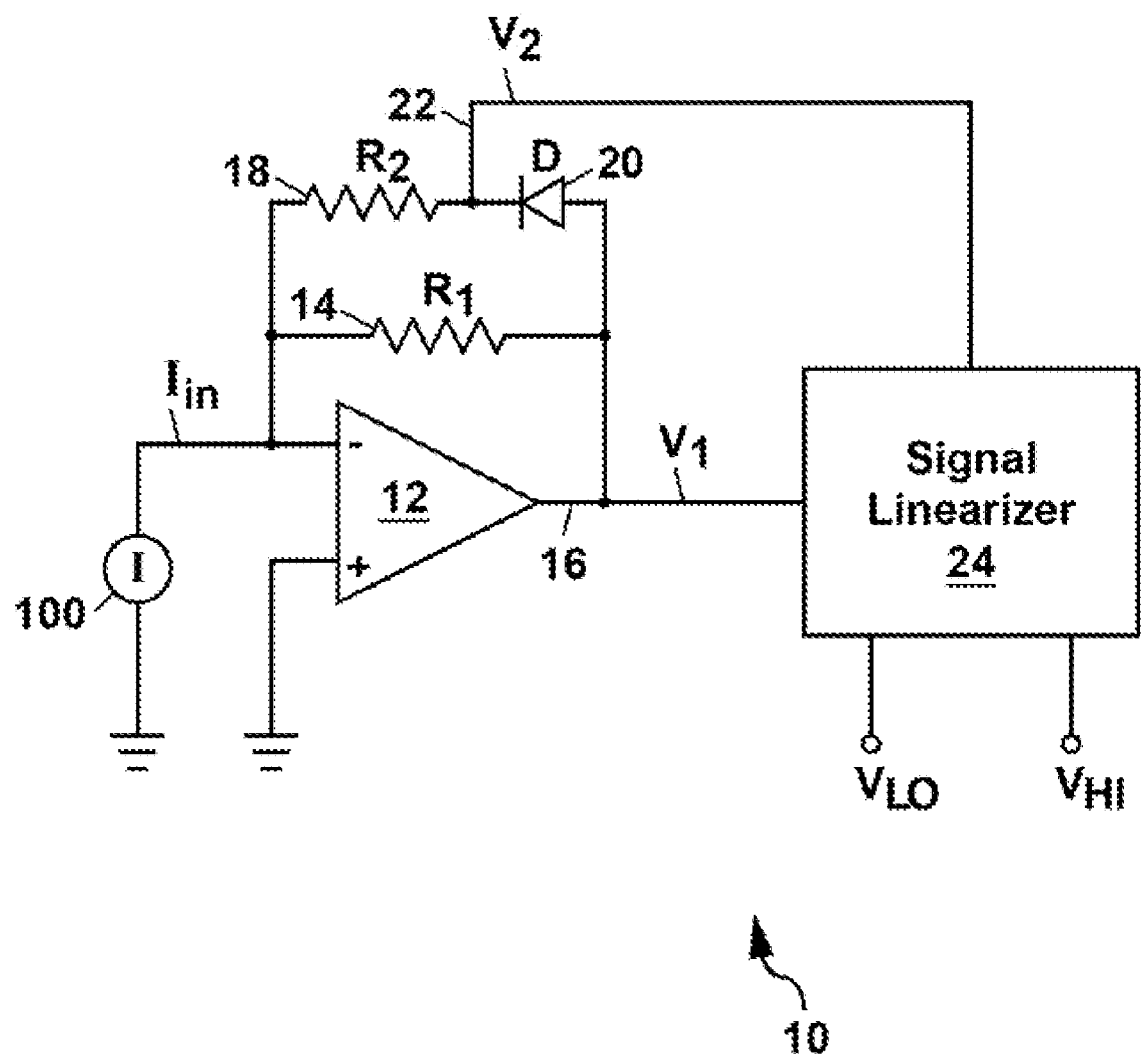
FIG. 1 shows a schematic diagram of a first example of a transimpedance amplifier system according to the present invention.

Referring to FIG. 1, there is shown a schematic diagram of a first example of a transimpedance amplifier system 10 according to the present invention. In FIG. 1, the transimpedance amplifier system 10 comprises a transimpedance amplifier 12 which receives an input current signal $I_{in}$ which can be generated by a current source 100. The current source 100 can be, for example, a photodetector or any other type of current source known to the art. The current signal $I_{in}$ can be provided to an inverting input (i.e. a negative input indicated in FIG. 1 by the symbol "−") of the transimpedance amplifier 12; and a non-inverting input (i.e. a positive input indicated in FIG. 1 by the symbol "+") can be electrically connected to ground as shown in FIG. 1.

In FIG. 1, the transimpedance amplifier 12 uses two different feedback loops which operate in parallel and which provide two different output voltage signals $V_1$ and $V_2$ with different signal amplification factors (i.e. different gains). A first resistor 14 with a resistance $R_1$ is used to form a first feedback loop between an output 16 of the transimpedance amplifier 12 and the inverting input for the amplifier 12. A series-connected combination of a second resistor 18 with a resistance $R_2$ and a diode 20 is used to form a second feedback loop about the transimpedance amplifier 12. The output voltage signal $V_1$ is provided at the first output 16. The output voltage signal $V_2$, which forms a second output 22 for the transimpedance amplifier 12, is taken from a node where the second resistor 18 is connected to the diode 20 at a cathode side thereof.

The term "diode" as used herein is defined as a two-terminal semiconductor device having an anode and a cathode and comprising a semiconductor p-n junction, a semiconductor p-i-n junction, or a metal-semiconductor junction. The term "diode" as used herein is also defined to include a transistor having a base, an emitter and a collector with the base being electrically connected to the collector so that the transistor functions as a diode (i.e. conducts electricity when forward-biased above a threshold voltage, and allows very little current conduction when reverse-biased).

In the example of FIG. 1, for a relatively small input current signal $I_{in}$, the output voltage signal $V_1$ will be below the threshold voltage, which is generally several tenths of a Volt, and therefore will be insufficient to turn on the diode 20. For this situation, the output voltage signal $V_1$ will be determined by the first feedback loop formed by the resistor $R_1$ according to the equation:

$$V_1 = I_{in} R_1.$$

During this time, essentially no electrical current will flow through the second feedback loop formed by the diode 20 and the second resistor $R_2$.

However, once the output voltage signal $V_1$ approaches the threshold voltage (or a sum of the threshold voltages when multiple diodes 20 are used) so that the diode 20 begins to conduct, an electrical current will begin to flow through the second feedback loop formed by the combination of the diode 20 and the second resistor $R_2$. This will result in the output voltage signal $V_1$ no longer being linearly related to the input current signal $I_{in}$, by the resistance $R_1$. Instead, the output voltage signal $V_1$ be determined by the parallel combination of the resistance $R_1$ and the sum of the resistance $R_2$ and the impedance of the diode 20.

And, as the input current signal $I_{in}$ increases further so that $V_1$ is above the threshold voltage and the diode 20 becomes electrically conducting with a relatively low impedance compared to the resistance $R_2$, the output voltage signal $V_1$ will be determined primarily by the resistance of $R_2$ taken in parallel with $R_1$. The net result is that the output voltage signal $V_1$ of the transimpedance amplifier 12 in FIG. 1 depends nonlinearly on the input current signal $I_{in}$ over a substantial range of the input current signal $I_{in}$ (see FIG. 2B).

The output voltage signal $V_2$ from the transimpedance amplifier 12 has a different dependence on the input current signal $I_{in}$ from that of the voltage signal $V_1$. When the input current signal $I_{in}$ is relatively small so that $V_1$ is below the threshold voltage and the diode 20 is not electrically conducting, then the output voltage signal $V_2$ is nil since very little, if any, electrical current flows through the resistor $R_2$. Once the voltage in the signal $V_1$ approaches the threshold voltage and the diode 20 begins to conduct, then the electrical current flowing through $R_2$ increases so that $V_2$ also increases. And, once the diode 20 is fully conducting most of the electrical current in the two feedback loops about the transimpedance amplifier 12 flows through $R_2$ when $R_2$ is much smaller than $R_1$ so that $V_2$ changes approximately linearly with a change in the input current signal $I_{in}$. However, over a substantial range of the input current signal $I_{in}$, $V_2$ is also nonlinearly related to $I_{in}$ (see FIG. 2C).

Figure 2A:
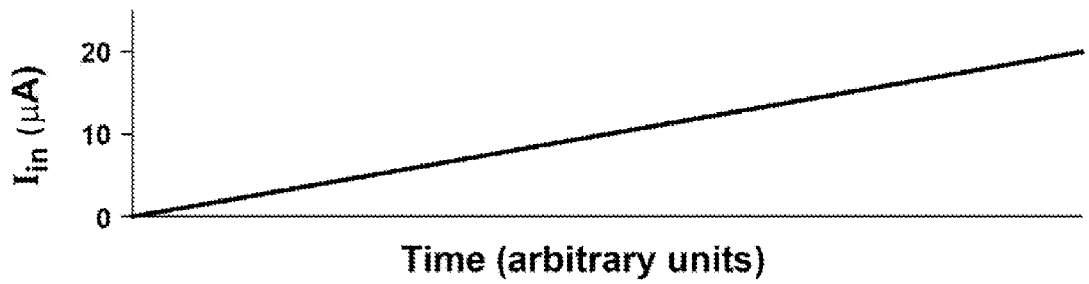
FIG. 2A shows an example of an input current signal $I_{in}$ which linearly increases with time.
Figure 2B:
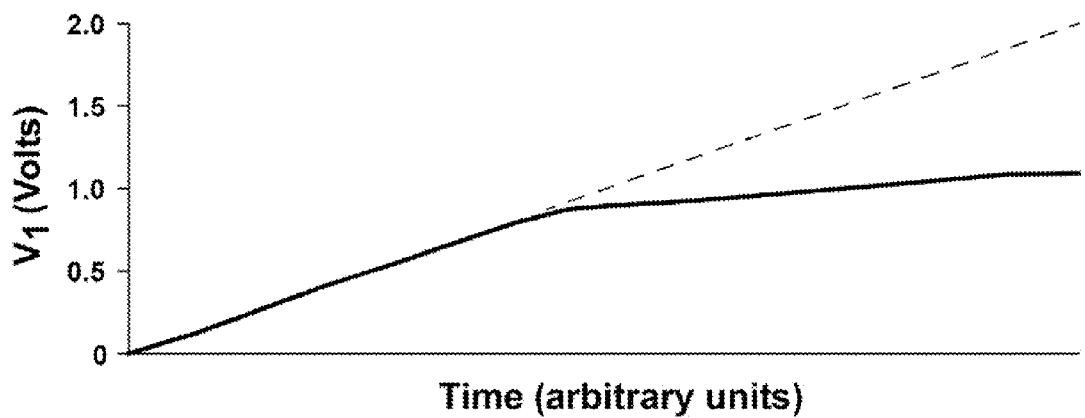
FIG. 2B shows an example of a first output voltage signal of the transimpedance amplifier for the input current signal $I_{in}$ of FIG. 2A.
Figure 2C:
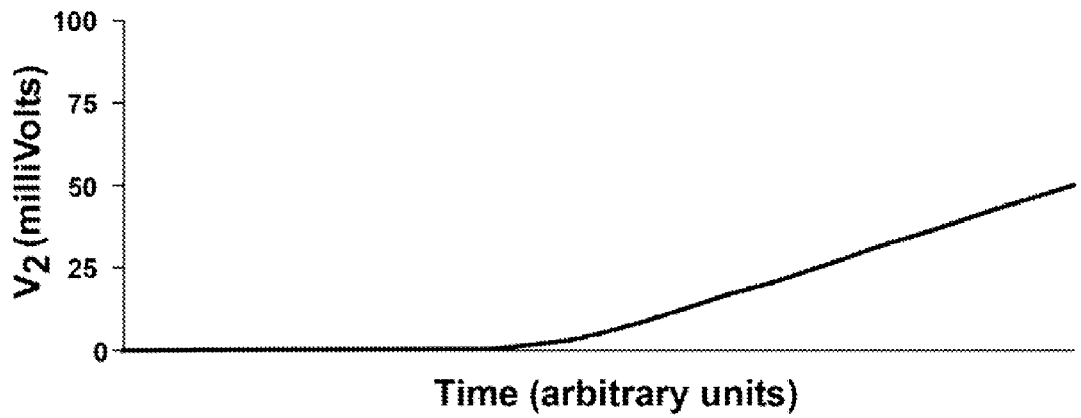
FIG. 2C shows an example of a second output voltage signal of the transimpedance amplifier for the input current signal $I_{in}$ of FIG. 2A.

The dependence of the output voltage signals $V_1$ and $V_2$ on the input current $I_{in}$ can be seen from FIGS. 2A-2C. FIG. 2A shows an example of the input current signal $I_{in}$ which increases linearly with time over a current range of 0-20 microamperes (μA) for a transimpedance amplifier 12 formed with feedback loops similar to FIG. 1 but with two diodes 20 connected in series with $R_2$, and with each diode 20 being formed from a transistor as will be described in detail hereinafter (see FIG. 4). For this transimpedance amplifier the two feedback loops have $R_1=100$ kΩ and $R_2=10$ kΩ.

FIG. 2B shows the dependence of the output voltage signal $V_1$ over time as the input current signal $I_{in}$ of FIG. 2A is linearly increased; and FIG. 2C shows the dependence of the output voltage signal $V_2$ with increasing $I_{in}$. The straight dashed line in FIG. 2B is provided to show the deviation of $V_2$ from a linear response to the input current signal $I_{in}$. As shown in FIGS. 2B and 2C, both of the output voltage signals $V_1$ and $V_2$ have different gain values and show a nonlinear dependence on the input current signal $I_{in}$ over different portions of the range of $I_{in}$ in FIG. 2A.

The transimpedance amplifier system 10 of the present invention corrects for the nonlinearities in $V_1$ and $V_2$ using a signal linearizer 24. The signal linearizer 24 takes the two output voltage signals $V_1$ and $V_2$ and scales each of them differently and then adds them together to generate a low-gain output signal $V_{LO}$ and a high-gain output signal $V_{HI}$ both of which are linearly related to the input current signal $I_{in}$ with different amplification factors.

In certain embodiments of the present invention where the high-gain output signal $V_{HI}$ is only used for small input current signals $I_{in}$, $V_{HI}$ can be generated from $V_1$ alone to provide an optimal signal-to-noise level. In these embodiments, the signal linearizer 24 can be used to combine $V_1$ and $V_2$ to linearize the low-gain output signal $V_{LO}$ which can be used once $V_{HI}$ becomes nonlinear (see the example of FIG. 5).

The scaling and addition processes of the transimpedance amplifier system 10 which linearizes the output signals $V_{LO}$ and $V_{HI}$ according to the following equations:

$$V_{LO} = V_1 \left(\frac{R_2}{R_1}\right) + V_2 = I_{in} R_2 \text{ and} \quad (1)$$

$$V_{HI} = V_1 + V_2 \left(\frac{R_1}{R_2}\right) = I_{in} R_1 \quad (2)$$

can be performed using an analog circuit, or by digitizing $V_1$ and $V_2$ and then processing the digitized signals in a digital signal processor according to the above equations. In Equation 1 above, the low-gain output signal $V_{LO}$ is linearly related to the input current signal $I_{in}$ by a signal amplification factor $R_2$ which is equal to the resistance of the second resistor 18. And, in Equation 2 above, the high-gain output signal $V_{HI}$ is also linearly related to the input current signal $I_{in}$ by a different signal amplification factor $R_1$, which is equal to the resistance of the first resistor 14.

Figure 3A:
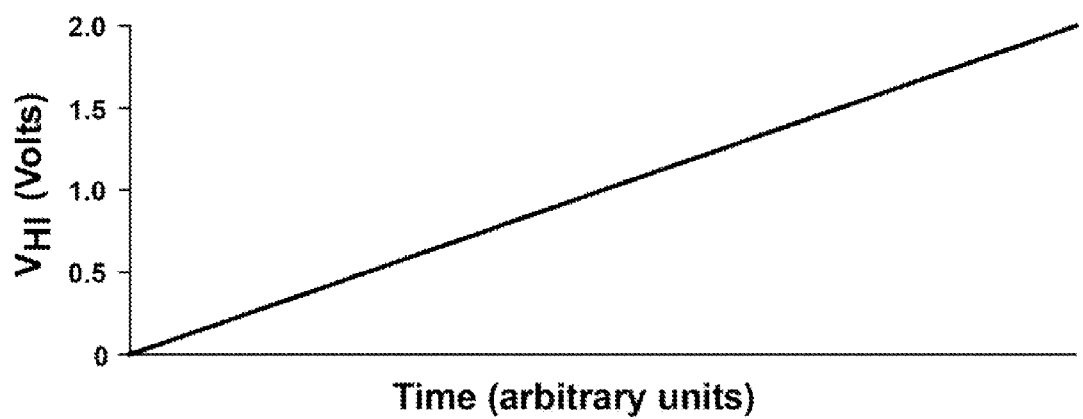
FIG. 3A shows a high-gain output voltage signal $V_{HI}$ produced in the signal linearizer by scaling up the second output voltage signal of FIG. 2C to form a scaled-up second output voltage signal which is then added to the first output voltage signal of FIG. 2B.
Figure 3B:
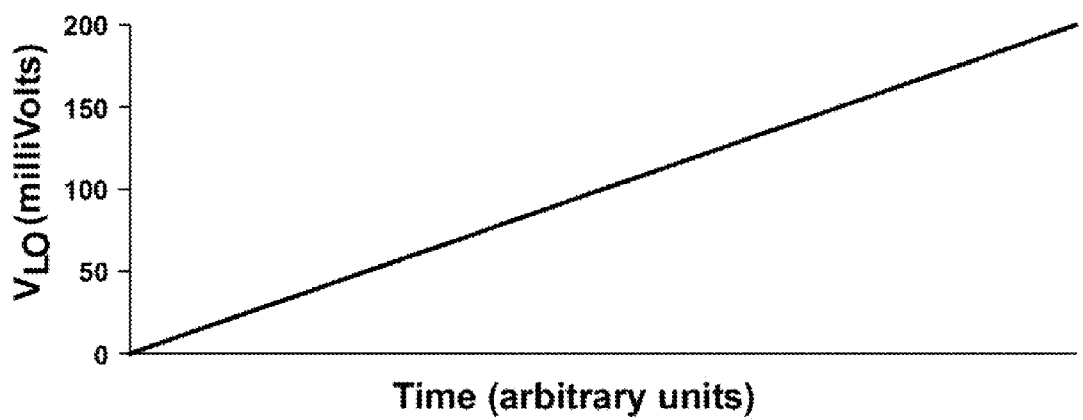
FIG. 3B shows a low-gain output voltage signal $V_{LO}$ produced in the signal linearizer by scaling down the first output voltage signal of FIG. 2B to form a scaled-down first output voltage signal which is then added to the second output voltage signal of FIG. 2C.

FIGS. 3A and 3B show, respectively, the resulting high-gain output signal $V_{HI}$ and low-gain output signal $V_{LO}$ which can be obtained in the transimpedance amplifier system 10 by scaling and adding the two voltage signals $V_1$ and $V_2$ in the example of FIGS. 2B and 2C using Equations 1 and 2 above. As shown in FIGS. 3A and 3B, both the high-gain output signal $V_{HI}$ and the low-gain output signal $V_{LO}$ can be made to be linearly related to the input current signal $I_{in}$. In the example of FIGS. 2A-2C and 3A, 3B, the difference in amplification between the high-gain output signal $V_{HI}$ and the low-gain output signal $V_{LO}$ is a factor of ten, but this difference in amplification can be arbitrarily increased by selecting different resistance values for $R_1$ and $R_2$.

By providing two different amplification factors (i.e. gains) in the transimpedance amplifier system 10 of the present invention, an input current signal $I_{in}$ can be amplified and reproduced even though the intensity of the signal $I_{in}$ varies over a dynamic range of several orders of magnitude. When the current signal $I_{in}$ is small, the high-gain output signal $V_{HI}$ can be selected and used to provide a high sensitivity for processing the signal $I_{in}$; and when the current signal $I_{in}$ becomes sufficiently large so that the high-gain output signal $V_{HI}$ becomes saturated, then the low-gain output signal $V_{LO}$ can be selected and used.

This ability of the transimpedance amplifier system 10 of the present invention to process an input current signal $I_{in}$ over a wide dynamic range and to provide both a high-gain output and a low-gain output is advantageous when the signal $I_{in}$ is a transient signal with an magnitude and/or shape which is unknown beforehand, or which varies over a wide dynamic range. By simultaneously generating the high- and low-gain output signals $V_{HI}$ and $V_{LO}$, respectfully, these two output signals can be captured and recorded or stored (e.g. in a transient digitizer or in a memory) and then used to accurately reconstruct a waveform of a transient signal. This is particularly useful for an input current signal $I_{in}$ which may occur only once and be present for only a short time duration. In such situations, the transimpedance amplifier system 10 of the present invention allows portions of the transient signal which have a relatively low intensity to be accurately determined from the high-gain output signal $V_{HI}$ and allows portions of the transient signal which may have an intensity which saturates the high-gain output signal $V_{HI}$ to be accurately determined from the low-gain output signal $V_{LO}$.

Figure 4:
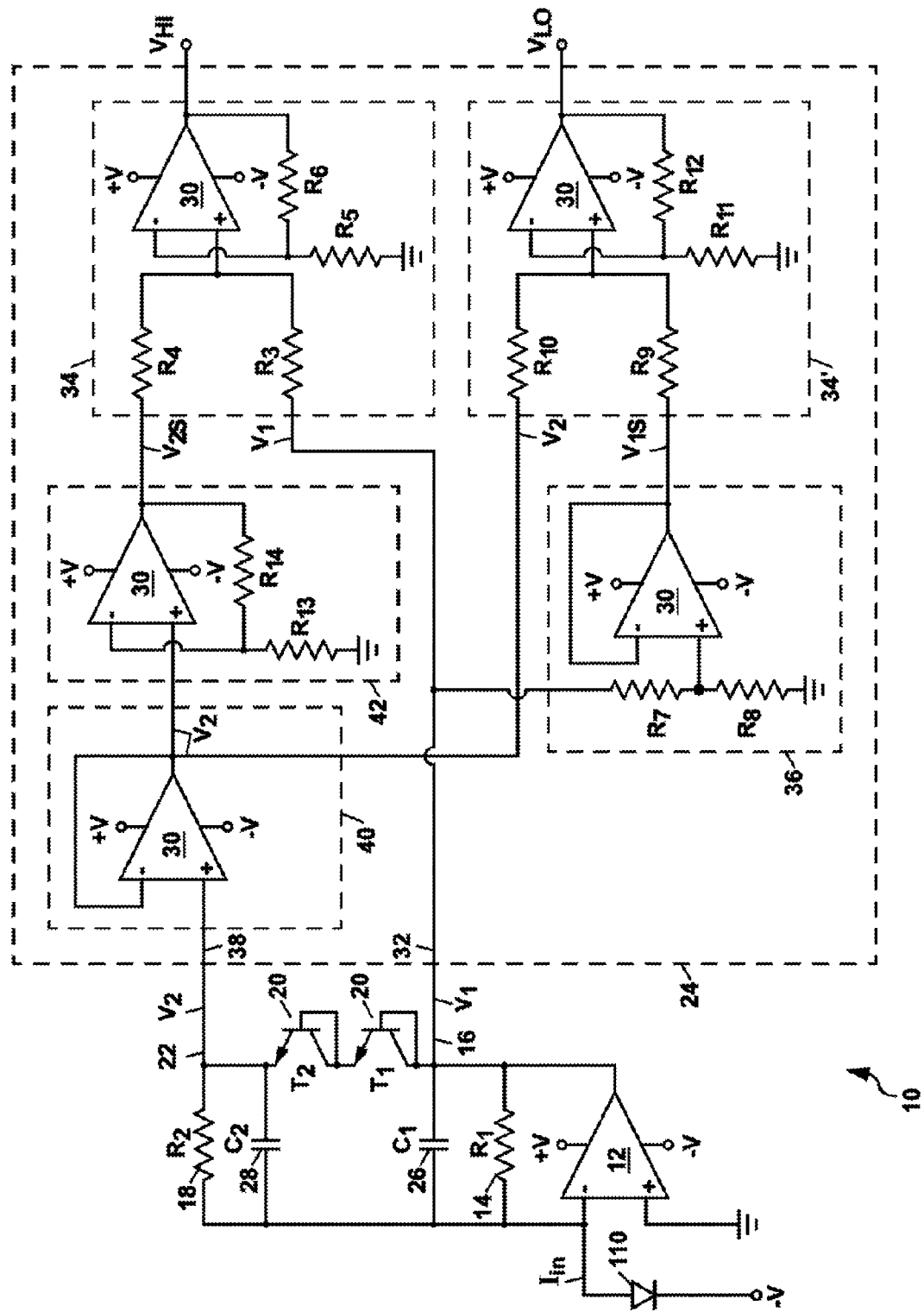
FIG. 4 shows a schematic diagram of a second example of the transimpedance amplifier system of the present invention.

FIG. 4 shows a second example of the transimpedance amplifier system 10 of the present invention in which the signal linearizer 24 operates in an analog manner to scale and add the voltage signals $V_1$ and $V_2$ to generate the low-gain output signal $V_{LO}$ and the high-gain output signal $V_{HI}$. In the example of FIG. 4, two diodes 20 are used with each diode 20 being formed from a transistor $T_1$ or $T_2$ by connecting the base of the transistor to the collector thereof. Those skilled in the art will understand that the exact number of diodes 20 used with the transimpedance amplifier 12 can vary depending upon the threshold voltage for the diodes 20 and also depending upon supply voltages $+V$ and $-V$ for the transimpedance amplifier 12.

In the example of FIG. 4, a first capacitor 26 with capacitance $C_1$ can be connected in parallel with the first resistor 14; and a second capacitor 28 with capacitance $C_2$ can be connected in parallel with the second resistor 18. When the first resistor 14 has a resistance $R_1 = 100$ k$\Omega$, the capacitance of the first capacitor 26 can be, for example, $C_1 = 5$ picoFarads (pF); and when the second resistor 18 has a resistance $R_2 = 10$ k$\Omega$, the second capacitor 28 can have a capacitance of, for example, $C_2 = 20\text{-}50$ pF. Those skilled in the art will understand that other values of the resistances $R_1$ and $R_2$ and other values of the capacitances $C_1$ and $C_2$ can be used.

The input current signal $I_{in}$ for the transimpedance amplifier system 10 of FIG. 4 is shown as being provided by a photodetector 110. The photodetector 110 can be biased by a power supply (not shown) with a negative voltage $(-V)$ which can be, for example, $-5$ Volts. The transimpedance amplifier 12 and other operational amplifiers 30 (op amps) shown in FIG. 4 can also operate using the same negative voltage and with a positive voltage $(+V)$ which can be, for example, $+5$ Volts.

In FIG. 4, the output voltage signal $V_1$ at the first output 16 is provided to a first linearizer input 32 of the signal linearizer 24. From the first linearizer input 32, the voltage signal $V_1$ is coupled into an input of a first summing amplifier 34 which comprises a resistor adding network formed from a pair of resistors $R_3$ and $R_4$, and one of the op amps 30 having resistors $R_5$ and $R_6$ connected thereabout as shown in FIG. 4. The resistance values of the resistors in the first summing amplifier 34 can be, for example, $R_3 = R_4 = 50$ k$\Omega$ and $R_5 = R_6 = 10$ k$\Omega$. With these values of resistances for the resistors $R_3$, $R_4$, $R_5$ and $R_6$ the first summing amplifier provides a unity gain for the high-gain output signal $V_{HI}$. In other embodiments of the present invention, different values for the resistors $R_5$ and $R_6$ can be used to provide an amplified high-gain output signal.

In FIG. 4, the voltage signal $V_1$ is also provided to a signal attenuator 36 which comprises a resistor dividing network formed by a pair of resistors with resistances $R_7$ and $R_8$, and an op amp 30. The signal attenuator 36 attenuates (i.e. scales down) the voltage signal $V_1$ to form an attenuated voltage signal $V_{1S}$ (also referred to herein as a scaled-down voltage signal $V_{1S}$) given by the equation:

$$V_{1S} = V_1 \left( \frac{R_2}{R_1} \right).$$

Thus, when $R_2 = 10$ k$\Omega$ and $R_1 = 100$ k$\Omega$, the voltage signal $V_1$ will be scaled down by a factor of 10 to form $V_{1S}$. This can be done, for example, with $R_7 = 9$ k$\Omega$ and $R_8 = 1$ k$\Omega$. In general, the resistors in the resistor dividing network can have arbitrary resistances which satisfy the following relationship:

$$\frac{R_8}{R_7 + R_8} = \frac{R_2}{R_1}.$$

The attenuated voltage signal $V_{1S}$ from the signal attenuator 36 is coupled into a second summing amplifier 34' which can comprise another resistor adding network formed by resistors $R_9$ and $R_{10}$ and an op amp 30 having a gain determined by resistors $R_{11}$ and $R_{12}$. This second summing amplifier 34' can be formed identically to the first summing amplifier 34 (e.g. with resistance values $R_9 = R_{10} = 50$ k$\Omega$ and with $R_{11} = R_{12} = 10$ k$\Omega$). Although the summing amplifiers 34 and 34' in FIG. 4 are non-inverting summing amplifiers, those skilled in the art will understand that inverting summing amplifiers can also be used to form the signal linearizer 24 in other embodiments of the present invention.

In FIG. 4, the output voltage signal $V_2$ from the second output 22 of the transimpedance amplifier 12 is provided to a second linearizer input 38 where the voltage signal $V_2$ is coupled through a buffer amplifier 40 formed from another op amp 30. This buffer amplifier 40 has a unity gain and provides a high input impedance to reduce any loading on the second feedback loop about the transimpedance amplifier 12. After passing through this buffer amplifier 40, the voltage signal $V_2$ is coupled into the second summing amplifier 34' where the voltage signal $V_2$ is added to the attenuated voltage signal $V_{1S}$ to generate the low-gain output signal $V_{LO}=V_{1S}+V_2$.

At the top of FIG. 4, the voltage signal $V_2$ in the signal linearizer 24 is amplified (i.e. scaled up) by a gain stage 42 (also termed an amplifier) to form an amplified voltage signal $V_{2S}$ given by:

$$V_{2S} = V_2 \left( \frac{R_1}{R_2} \right).$$

The amplified voltage signal $V_{2S}$ is then coupled into the first summing amplifier 34 which adds $V_1$ and $V_{2S}$ to generate the high-gain output signal $V_{HI}=V_1+V_{2S}$.

The gain stage 42 in FIG. 4 is formed by another op amp 30 with resistors $R_{13}$ and $R_{14}$. In general, the resistors $R_{13}$ and $R_{14}$ can have arbitrary resistances which satisfy the following relationship:

$$\frac{R_{13} + R_{14}}{R_{13}} = \frac{R_1}{R_2}$$

where $R_1/R_2$ is the amplification factor (i.e. gain) to be provided by the gain stage 42. As an example, when $R_1=100$ k$\Omega$ and $R_2=10$ k$\Omega$, the amplification factor will be 10. This amplification factor can be provided, for example, with $R_{13}=1$ k$\Omega$ and $R_{14}=9$ k$\Omega$.

Figure 5:
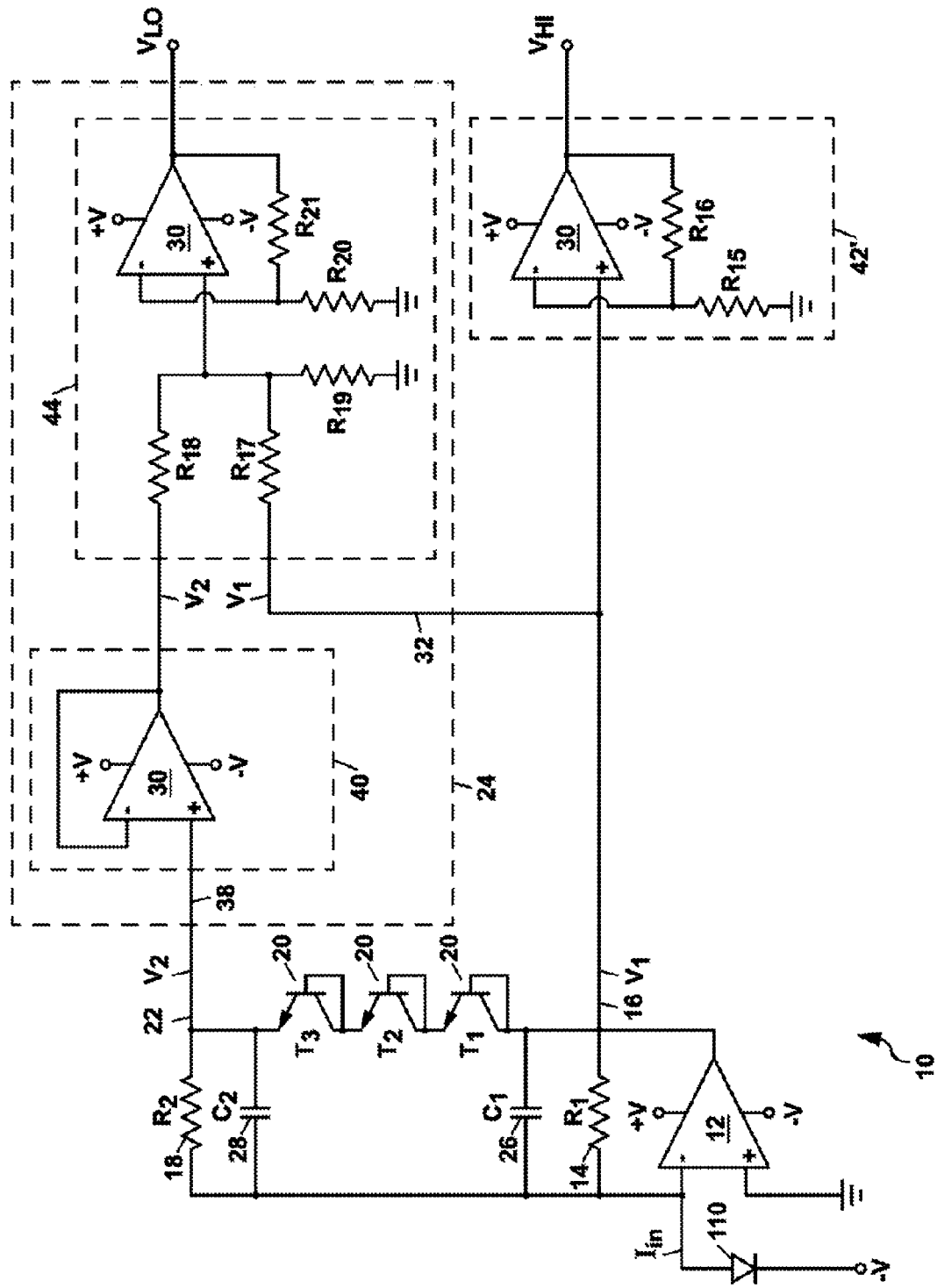
FIG. 5 shows a schematic diagram of a third example of the transimpedance amplifier system of the present invention.

FIG. 5 shows another example of the transimpedance amplifier system 10 of the present invention which can be formed as an analog circuit. This third example of the transimpedance amplifier system 10 is useful, for example, where an optimal signal-to-noise ratio is needed for detecting the input current signal $I_{in}$. Since the resistors $R_3$ and $R_4$ in the summing amplifier 34 in FIG. 4 are noise sources, this summing amplifier 34 is eliminated from the system 10 of FIG. 5 which, instead, generates the high-gain output signal $V_{HI}$ by using only $V_1$. The output voltage signal $V_1$ in the example of FIG. 5 is routed directly to an amplifier input of a gain stage 42', or a buffer amplifier 40, with the output of the gain stage 42' or the buffer amplifier 40 providing the high-gain output signal $V_{HI}$. The amplification provided by the gain stage 42' can be arbitrary and can be predetermined by a pair of resistors $R_{15}$ and $R_{16}$ connected about the gain stage 42' as shown in FIG. 5. As an example, the gain stage 42' can amplify the output voltage signal $V_1$ by a factor of 10 to form an amplified high-gain output voltage $V_{HI}$ when $R_{15}=1$ k$\Omega$ and $R_{16}=9$ k$\Omega$.

Since the output voltage signal $V_2$ is not used in forming the high-gain output signal $V_{HI}$ in the example of FIG. 5, then $V_{HI}$ will become nonlinear above a certain level of $V_1$ which is approximately equal to a sum of the threshold voltages of each diode 20 in the second feedback loop about the transimpedance amplifier (see FIG. 2B). This nonlinearity of the high-gain output signal $V_{HI}$ can be acceptable for certain applications since the level where $V_1$ becomes nonlinear can be predetermined from the number of diodes 20 used in the second feedback loop about the transimpedance amplifier 12. Also, for high input current signal levels where $V_{HI}$ becomes nonlinear, the low-gain output signal $V_{LO}$ can be used. In the example of FIG. 5, three diodes 20 are used although those skilled in the art will understand that the number of diodes 20 in the transimpedance amplifier system 10 is arbitrary and can be selected depending upon a particular application for the system 10.

In FIG. 5, a signal linearizer 24 containing a summing amplifier 44 is used to generate the low-gain output signal $V_{LO}$ by scaling and adding the output voltage signals $V_1$ and $V_2$. The output voltage signals $V_1$ and $V_2$, which are provided to different inputs of the summing amplifier 44 at one side of resistors $R_{17}$ and $R_{18}$, are scaled differently in the summing amplifier 44, with $V_1$ being attenuated by a factor of $R_2/R_1$ relative to $V_2$. As an example, when $R_2/R_1=100$ k$\Omega/10$ k$\Omega=10$, the output voltage signal $V_1$ can be scaled down by a factor of 10 relative to $V_2$ prior to adding together these two voltage signals and amplifying the result to form the low-gain output voltage $V_{LO}$ at the output of the summing amplifier 44. This can be done, for example, by providing the resistors in the summing amplifier 44 with the following resistance values: $R_{17}=4.66$ k$\Omega$, $R_{18}=0.466$ k$\Omega$, $R_{19}=2$ k$\Omega$, $R_{20}=6$ k$\Omega$ and $R_{21}=2$ k$\Omega$.

The transimpedance amplifier system 10 in the examples of FIGS. 4 and 5 can be formed as an integrated circuit (IC), or alternately can be formed as a hybrid circuit using discrete components.

In the previous examples of FIGS. 4 and 5, the high-gain output signal $V_{HI}$ and the low-gain output signal $V_{LO}$ are analog signals and can be converted into digital signals, if needed, using analog-to-digital converters. In other embodiments of the transimpedance amplifier system 10 of the present invention, the voltage signals $V_1$ and $V_2$ can be initially converted into digital signals within the signal linearizer 24 and then processed therein as digital signals to form the low- and high-gain output signals $V_{LO}$ and $V_{HI}$ as digital signals. This can be useful, for example, when the input current signal $I_{in}$ is a transient signal since the digitized signals formed from $V_1$ and $V_2$ and/or $V_{LO}$ and $V_{HI}$ can be stored in a memory which can be provided in the signal linearizer 24 or external thereto.

Figure 6:
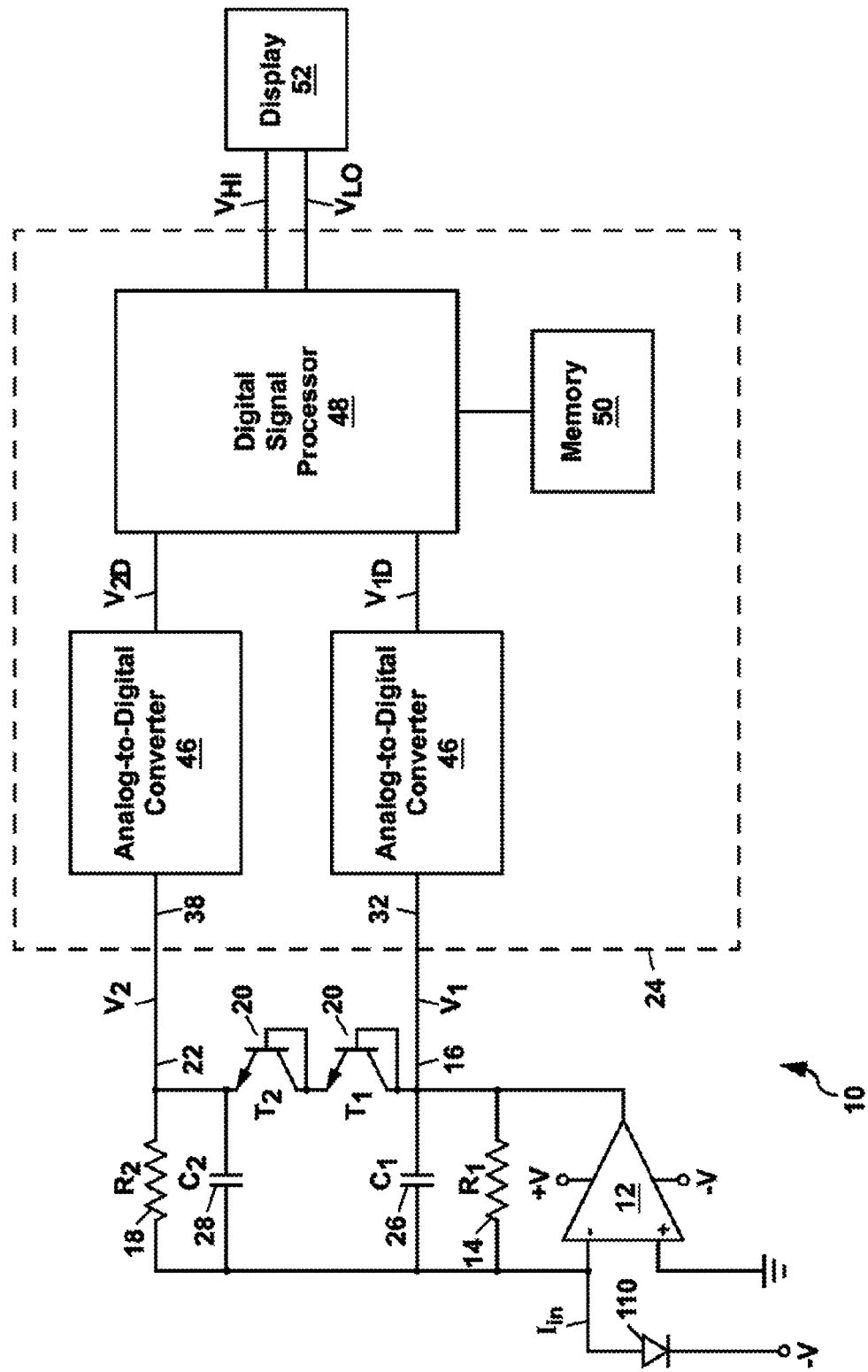
FIG. 6 shows a schematic diagram of a fourth example of the transimpedance amplifier system of the present invention.

FIG. 6 shows a fourth example of the transimpedance amplifier system 10 in which the signal linearizer 24 initially converts the voltage signals $V_1$ and $V_2$ into digital signals and then digitally processes the digital signals to form $V_{LO}$ and $V_{HI}$ as digital signals. In this example of the present invention, the signal linearizer 24 comprises a pair of analog-to-digital converters 46 and a digital signal processor 48, and can also include a memory 50.

In the example of FIG. 6, the voltage signal $V_1$ is coupled into the first linearizer input 32 and therefrom to one of the analog-to-digital converters 46 which forms a first digital voltage signal $V_{1D}$ (also referred to herein as a first digital signal) from the voltage signal $V_1$. The analog-to-digital converter 46 can operate with a clock (not shown) to generate a plurality of bytes of digital information corresponding to the intensity of the voltage signal $V_1$ at different instants in time and assemble these bytes of digital information into a data stream which forms the first digital voltage signal $V_{1D}$. Similarly, the output voltage signal $V_2$ can be coupled into the second linearizer input 38 and therefrom to the other analog-to-digital converter 46 to generate a second digital voltage signal $V_{2D}$ (also referred to herein as a second digital signal) from the output voltage signal $V_2$.

Analog-to-digital converters are well known in the art and therefore need not be described herein in detail. The analog-to-digital converters 46 used to form the transimpedance amplifier system 10 of FIG. 6 can be procured commercially. In some embodiments of the present invention, the analog-to-digital converters 46 can be formed as integrated circuits on a common substrate containing the transimpedance amplifier 12, the digital signal processor 48 and the memory 50. In other embodiments of the present invention, the analog-to-digital converters 46 can be provided as integrated circuits and assembled in a multi-chip module or on a printed circuit board alongside the transimpedance amplifier 12, the digital signal processor 48 and the memory 50.

The first and second digital signals $V_{1D}$ and $V_{2D}$, respectively, are then provided as inputs to the digital signal processor 48 which can comprise a microprocessor or a computer. The digital signal processor 48 scales down the first digital voltage signal $V_{1D}$ by numerically multiplying $V_{1D}$ by a pre-determined scale factor $R_2/R_1$ where $R_1$ and $R_2$ are the values of the resistance used in the two feedback loops about the transimpedance amplifier 12 in FIG. 6. This numerical multiplication, which is performed digitally, forms a scaled-down first digital signal $V_{1DS}$ given by:

$$V_{1DS} = V_{1D}\left(\frac{R_2}{R_1}\right)$$

where each byte of information in the digitized $V_{1D}$ signal is multiplied by the scale factor $R_2/R_1$ to form a byte of information for digitized $V_{1DS}$ signal. Similarly, the digital signal processor 48 scales up the second digital signal $V_{2D}$ by numerically multiplying $V_{2D}$ by the scale factor $R_1/R_2$ to form a scaled-up second digital signal $V_{2DS}$ given by:

$$V_{2DS} = V_{2D}\left(\frac{R_1}{R_2}\right).$$

Each of the digital signals $V_{1D}$, $V_{1DS}$, $V_{2D}$ and $V_{2DS}$ can be stored in the memory 50 and used to compute the low-gain output signal $V_{LO}$ and the high-gain output signal $V_{HI}$ using the following equations:

$$V_{LO} = V_{1DS} + V_{2D} = V_{1D}\left(\frac{R_2}{R_1}\right) + V_{2D} \text{ and}$$

$$V_{HI} = V_{1D} + V_{2DS} = V_{1D} + V_{2D}\left(\frac{R_1}{R_2}\right).$$

The output voltage signals $V_{LO}$ and $V_{HI}$ formed in this way are also digital signals which can be stored in the memory 50 and displayed using a display 52 (e.g. a computer screen).

Although a single transimpedance amplifier system 10 has been described in the examples of FIGS. 1, 4, 5 and 6, a plurality of transimpedance amplifier systems 10 can be formed according to the present invention. The plurality of transimpedance amplifier systems 10 can be formed on a common substrate as an IC, as a multi-chip module, or on a printed circuit board. The use of a plurality of transimpedance amplifier systems 10 is useful, for example, to process a plurality of input current signals generated by a photodetector array. Each individual photodetector element in the photodetector array can be coupled into a different transimpedance amplifier system 10 to process an input current signal $I_{in}$ generated by that photodetector element when light is detected and thereby generate low-gain and high-gain output signals $V_{LO}$ and $V_{HI}$ which are linearly related to the input current signal $I_{in}$ for that photodetector element. This can be used, for example, to image light which varies over a wide dynamic range, or to capture a transient light signal which may be detected by one or more photodetectors in the photodetector array.

The transimpedance amplifier system 10 can also be adapted for operation with input current signals $I_{in}$ having dual polarities. This can be done, for example, by adding a third feedback loop about the transimpedance amplifier 12 which is formed identically to the second feedback loop except for having one or more diodes 20 which are oppositely oriented from the diodes 20 in the second feedback loop. This third feedback loop can provide a third output voltage signal $V_3$ at a node between the third resistor and the oppositely-oriented diode(s) 20 in the third feedback loop. The output voltage signals $V_2$ and $V_3$ can then be summed together with the result $V_2+V_3$ being scaled and summed with the first output voltage signal $V_1$ to form the low-gain output voltage $V_{LO}$ and/or the high-gain output voltage $V_{HI}$.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A transimpedance amplifier system to receive an input current signal and to generate therefrom a low-gain output signal and a high-gain output signal, comprising:
    a transimpedance amplifier having a first resistor connected between an output of the transimpedance amplifier and an input thereof, and with a series-connected combination of a diode and a second resistor being connected between the output of the transimpedance amplifier and the input thereof, with an anode side of the diode being connected to the output of the transimpedance amplifier, and with a cathode side of the diode being connected to the second resistor at a node therebetween; and
    a signal linearizer having a first linearizer input connected to the amplifier output to receive a first voltage signal generated from the input current signal by the transimpedance amplifier, and a second linearizer input connected to the node between the diode and the second resistor to receive a second voltage signal generated from the input current signal by the transimpedance amplifier, and with the signal linearizer scaling down the first voltage signal to form a scaled-down first voltage signal and scaling up the second voltage signal to form therefrom a scaled-up second voltage signal, and with the signal linearizer adding the scaled-down first voltage signal to the second voltage signal to generate the low-gain output signal, and with the signal linearizer adding the scaled-up second voltage signal to the first voltage signal to generate the high-gain output signal, and with the low-gain output signal and the high-gain output signal both being linearly related to the input current signal.

2. The transimpedance amplifier system of claim 1 further comprising a first capacitor connected in parallel with the first resistor, and a second capacitor connected in parallel with the second resistor.

3. The transimpedance amplifier system of claim 1 wherein the diode is formed from a transistor having a base, an emitter and a collector with the base being electrically connected to the collector.

4. The transimpedance amplifier system of claim 1 wherein signal linearizer comprises:
    an attenuator to scale down the first voltage signal to form the scaled-down first voltage signal;

a gain stage to scale up the second voltage signal to form the scaled-up second voltage signal;

a first summing amplifier to add the scaled-down first voltage signal to the second voltage signal; and a second summing amplifier to add the scaled-up second voltage signal to the first voltage signal.

5. The transimpedance amplifier system of claim 1 wherein the signal linearizer includes a pair of analog-to-digital converters and a digital signal processor, with the analog-to-digital converters converting the first voltage signal and the second voltage signal into digital signals, and with the digital signal processor scaling down the first voltage signal to form the scaled-down first voltage signal and scaling up the second voltage signal to form the scaled-up second voltage signal, and with the digital signal processor adding the scaled-down first voltage signal to the second voltage signal to generate the low-gain output signal, and with the digital signal processor adding the scaled-up second voltage signal to the first voltage signal to generate the high-gain output signal.

6. The transimpedance amplifier system of claim 5 wherein the digital signal processor comprises a microprocessor or a computer.

7. The transimpedance amplifier system of claim 5 wherein the transimpedance amplifier system includes a display to display the low-gain output signal and the high-gain output signal.

8. A transimpedance amplifier system to generate a high-gain output signal and a low-gain output signal from an input current signal, comprising:

a transimpedance amplifier having a first feedback loop which includes a first resistor, with the first feedback loop extending between a first output of the transimpedance amplifier and an input thereof wherein the input current signal is received, and a second feedback loop which includes a series connection of at least one diode and a second resistor, with the second feedback loop extending between the first output of the transimpedance amplifier and the input thereof, and with a second output of the transimpedance amplifier being located at a node connecting the at least one diode to the second resistor; and a signal linearizer to receive a first voltage signal from the first output of the transimpedance amplifier and to attenuate the first voltage signal with an attenuator comprising a resistor dividing network to form an attenuated first voltage signal, and to receive a second voltage signal from the second output of the transimpedance amplifier and to amplify the second voltage signal with a gain stage to form an amplified second voltage signal, and to add the first voltage signal to the amplified second voltage signal in a first summing amplifier to form the high-gain output signal, and to add the second voltage signal to the attenuated first voltage signal in a second summing amplifier to form the low-gain output signal.

9. The transimpedance amplifier system of claim 8 wherein a ratio of the attenuated first voltage signal to the first voltage signal is substantially equal to the ratio of a resistance of the second resistor to the resistance of the first resistor, and the ratio of the amplified second voltage signal to the second voltage signal is substantially equal to the ratio of the resistance of the first resistor to the resistance of the second resistor.

10. The transimpedance amplifier system of claim 8 wherein each diode is formed from a transistor having a base, an emitter and a collector, with the base and the collector being electrically connected together.

11. The transimpedance amplifier system of claim 8 wherein the first feedback loop includes a first capacitor electrically connected in parallel with the first resistor, and the second feedback loop includes a second capacitor electrically connected in parallel with the second resistor.

12. A transimpedance amplifier system, comprising:

a transimpedance amplifier having an input to receive an input current signal, and an output;

a first feedback loop comprising a first resistor electrically connected between the output and the input of the transimpedance amplifier;

a second feedback loop comprising at least one transistor and a second resistor electrically connected in series between the output and the input of the transimpedance amplifier, with each transistor comprising a base, an emitter and a collector, and with the base and the collector of the at least one transistor being electrically connected together and further being electrically connected to the output of the transimpedance amplifier, and with the emitter of the at least one transistor being electrically connected through the second resistor to the input of the transimpedance amplifier; and a signal linearizer having a first linearizer input and a second linearizer input, with the first linearizer input being electrically connected to the output of the transimpedance amplifier to receive a first voltage signal generated from the input current signal by the transimpedance amplifier, and with the second linearizer input being electrically connected to a node wherein the emitter of the at least one transistor is electrically connected to the second resistor to receive a second voltage signal generated from the input current signal by the transimpedance amplifier, and with the linearizer circuit scaling down the first voltage signal to form a scaled-down first voltage signal and scaling up the second voltage signal to form a scaled-up second voltage signal, and with the signal linearizer adding the scaled-down first voltage signal to the second voltage signal to generate a low-gain output signal, and with the signal linearizer adding the scaled-up second voltage signal to the first voltage signal to generate a high-gain output signal.

13. The transimpedance amplifier system of claim 12 further comprising a first capacitor electrically connected in parallel with the first resistor, and a second capacitor electrically connected in parallel with the second resistor.

14. The transimpedance amplifier system of claim 12 wherein the signal linearizer comprises:

a resistor dividing network to scale down the first voltage signal to form the scaled-down first voltage signal;

an amplifier to scale up the second voltage signal to form the scaled-up second voltage signal;

a first summing amplifier to add the scaled-down first voltage signal to the second voltage signal; and a second summing amplifier to add the scaled-up second voltage signal to the first voltage signal.

15. The transimpedance amplifier system of claim 12 wherein a ratio of the first voltage signal to the scaled-down first voltage signal is substantially equal to the ratio of the scaled-up second voltage signal to the second voltage signal.

16. The transimpedance amplifier system of claim 12 wherein the signal linearizer includes a pair of analog-to-digital converters and a digital signal processor, with the analog-to-digital converters converting the first voltage signal and the second voltage signal into digital signals, and with the digital signal processor scaling down the first voltage signal to form the scaled-down first voltage signal and scaling up the second voltage signal to form the scaled-up second voltage signal, and with the digital signal processor adding the scaled-down first voltage signal to the second voltage signal to generate the low-gain output signal, and with the digital signal processor adding the scaled-up second voltage signal to the first voltage signal to generate the high-gain output signal.

17. The transimpedance amplifier system of claim 16 wherein the digital signal processor comprises a microprocessor or a computer.

18. The transimpedance amplifier system of claim 16 wherein the transimpedance amplifier system includes a display to display the low-gain output signal and the high-gain output signal.

19. A transimpedance amplifier system, comprising:
a transimpedance amplifier having an input to receive an input current signal and to generate therefrom a first output voltage signal and a second output voltage signal, with the two output voltage signals having different signal amplification factors, and with the transimpedance amplifier having a first feedback loop which includes a first resistor to provide the first output voltage signal, and with the transimpedance amplifier having a second feedback loop which includes a second resistor and at least one semiconductor diode to provide the second output voltage signal at a node wherein the second resistor is electrically connected to the at least one semiconductor diode;
a first analog-to-digital converter to receive the first output voltage and to convert the first output voltage signal into a first digital signal;
a second analog-to-digital converter to receive the second output voltage and to convert the second output voltage signal into a second digital signal; and
a digital signal processor to receive the first digital signal and the second digital signal, and to scale down the first digital signal to form a scaled-down first digital signal, and to scale up the second digital signal to form a scaled-up second digital signal, with the digital signal processor providing a low-gain output signal from a sum of the scaled-down first digital signal and the second digital signal and providing a high-gain output signal from a sum of the scaled-up second digital signal and the first digital signal, with the low-gain output signal and the high-gain output signal both being linearly related to the input current signal.

20. The transimpedance amplifier system of claim 19 further comprising a memory to store the low-gain output signal and the high-gain output signal.

21. The transimpedance amplifier system of claim 19 further comprising a display to display the low-gain output signal and the high-gain output signal.

22. The transimpedance amplifier system of claim 19 wherein the digital signal processor comprises a microprocessor or a computer.

23. The transimpedance amplifier system of claim 19 wherein each semiconductor diode is formed from a transistor having a base, an emitter and a collector, with the base being electrically connected to the collector.

24. A transimpedance amplifier system to generate a high-gain output signal and a low-gain output signal from an input current signal, comprising:
a transimpedance amplifier having a first feedback loop which includes a first resistor, with the first feedback loop extending between a first output of the transimpedance amplifier and an input thereof wherein the input current signal is received, and a second feedback loop which includes a series connection of at least one diode and a second resistor, with the second feedback loop extending between the first output of the transimpedance amplifier and the input thereof, and with a second output of the transimpedance amplifier being located at a node connecting the at least one diode to the second resistor;
an amplifier having an amplifier input which is connected to the transimpedance amplifier to receive a first voltage signal from the first output of the transimpedance amplifier, and an amplifier output which provides the high-gain output signal generated within the amplifier from the first voltage signal; and
a signal linearizer which includes a summing amplifier having a first summing-amplifier input connected to receive the first voltage signal from the first output of the transimpedance amplifier, and a second summing amplifier input connected to receive a second voltage signal from the second output of the transimpedance amplifier, and a summing amplifier output which provides the low-gain output signal which is generated by scaling and adding the first voltage signal and the second voltage signal.

25. The transimpedance amplifier system of claim 24 further comprising a first capacitor connected in parallel with the first resistor, and a second capacitor connected in parallel with the second resistor.

26. The transimpedance amplifier system of claim 24 wherein each diode is formed from a transistor having a base, an emitter and a collector, with the base and the collector being electrically connected together.

* * * * *